United States Patent
Dechoux et al.

(10) Patent No.: US 9,331,242 B2
(45) Date of Patent: May 3, 2016

(54) OPTOELECTRONIC DEVICE AND METHOD FOR MANUFACTURING SAME

(71) Applicants: ALEDIA, Grenoble (FR); Commissariat à l'Energie Atomique et aux Energies Alternatives, Paris (FR)

(72) Inventors: Nathalie Dechoux, Le Fontanil Cornillon (FR); Benoît Amstatt, Grenoble (FR); Philippe Gilet, Teche (FR)

(73) Assignees: ALEDIA (FR); COMMISSARIAT A L'ENERGIE ATOMIQUE ET AUX ENEREGIES ALTERNATIVES (FR)

( * ) Notice: Subject to any disclaimer, the term of this patent is extended or adjusted under 35 U.S.C. 154(b) by 0 days.

(21) Appl. No.: 14/438,266

(22) PCT Filed: Oct. 25, 2013

(86) PCT No.: PCT/FR2013/052551
§ 371 (c)(1),
(2) Date: Apr. 24, 2015

(87) PCT Pub. No.: WO2014/064395
PCT Pub. Date: May 1, 2014

(65) Prior Publication Data
US 2015/0255677 A1    Sep. 10, 2015

(30) Foreign Application Priority Data

Oct. 26, 2012 (FR) .................................. 12 60232
Mar. 28, 2013 (FR) .................................. 13 52794

(51) Int. Cl.
*H01L 21/20* (2006.01)
*H01L 21/36* (2006.01)
(Continued)

(52) U.S. Cl.
CPC ............... *H01L 33/24* (2013.01); *B82Y 20/00* (2013.01); *B82Y 40/00* (2013.01);
(Continued)

(58) Field of Classification Search
USPC .............................. 257/1, 9, 13, 615; 438/479
See application file for complete search history.

(56) References Cited

U.S. PATENT DOCUMENTS 7,829,443 B2    11/2010    Seifert et al.
2006/0063358 A1    3/2006    Bedell et al.
(Continued)

FOREIGN PATENT DOCUMENTS

FR    2925979 A1    7/2009
WO    2009/072631 A1    6/2009
WO    2012/136665 A1    10/2012

OTHER PUBLICATIONS

Chen et al:, Homoepitaxial growth of catalyst-free GaN wires on N-polar substrates°, Applied Physics Letters, AIP, American Institute of Physics, Melville, NY, US, vol. 97, No. 15, Oct. 13, 2010, 151909-151909, 3 pages.

(Continued)

*Primary Examiner* — Errol Fernandes
(74) *Attorney, Agent, or Firm* — Howard IP Law Group, PC

(57) ABSTRACT

An optoelectronic device comprises a substrate; pads on a surface of the substrate; semiconductor elements, each element resting on a pad; a portion covering at least the lateral sides of each pad, the portion preventing the growth of the semiconductor elements on the lateral sides; and a dielectric region extending in the substrate from the surface and connecting, for each pair of pads, one of the pads in the pair to the other pad in the pair. A method of manufacturing an optoelectronic device is also disclosed.

3 Claims, 6 Drawing Sheets

(51) Int. Cl.
- *H01L 33/24* (2010.01)
- *B82Y 40/00* (2011.01)
- *H01L 21/02* (2006.01)
- *H01L 31/0352* (2006.01)
- *H01L 33/00* (2010.01)
- *H01L 33/08* (2010.01)
- *H01L 33/18* (2010.01)
- *H01L 31/0296* (2006.01)
- *H01L 31/0304* (2006.01)
- *B82Y 20/00* (2011.01)
- *H01L 31/0224* (2006.01)
- *H01L 31/028* (2006.01)
- *H01L 31/18* (2006.01)
- *H01L 33/38* (2010.01)

(52) U.S. Cl.
CPC ....... *H01L 21/0254* (2013.01); *H01L 21/0262* (2013.01); *H01L 21/02381* (2013.01); *H01L 21/02458* (2013.01); *H01L 21/02603* (2013.01); *H01L 21/02639* (2013.01); *H01L 31/028* (2013.01); *H01L 31/0296* (2013.01); *H01L 31/022408* (2013.01); *H01L 31/0304* (2013.01); *H01L 31/035227* (2013.01); *H01L 31/035281* (2013.01); *H01L 31/1804* (2013.01); *H01L 31/184* (2013.01); *H01L 31/1808* (2013.01); *H01L 31/1828* (2013.01); *H01L 33/007* (2013.01); *H01L 33/0054* (2013.01); *H01L 33/0062* (2013.01); *H01L 33/0083* (2013.01); *H01L 33/08* (2013.01); *H01L 33/18* (2013.01); *H01L 33/38* (2013.01); *H01L 2933/0016* (2013.01)

(56) References Cited

U.S. PATENT DOCUMENTS

| | | |
|---|---|---|
| 2007/0217460 A1 | 9/2007 | Ishibashi et al. |
| 2008/0093622 A1 | 4/2008 | Li et al. |
| 2008/0224115 A1* | 9/2008 | Bakkers ................. B82Y 10/00 257/1 |
| 2010/0148149 A1 | 6/2010 | Pedersen et al. |
| 2011/0140072 A1 | 6/2011 | Varangis et al. |
| 2012/0001303 A1 | 1/2012 | Huang et al. |
| 2012/0211759 A1 | 8/2012 | Liu et al. |

OTHER PUBLICATIONS

English language translation of the search report dated Mar. 12, 2014 in connection with related PCT/FR2013/052551.

* cited by examiner

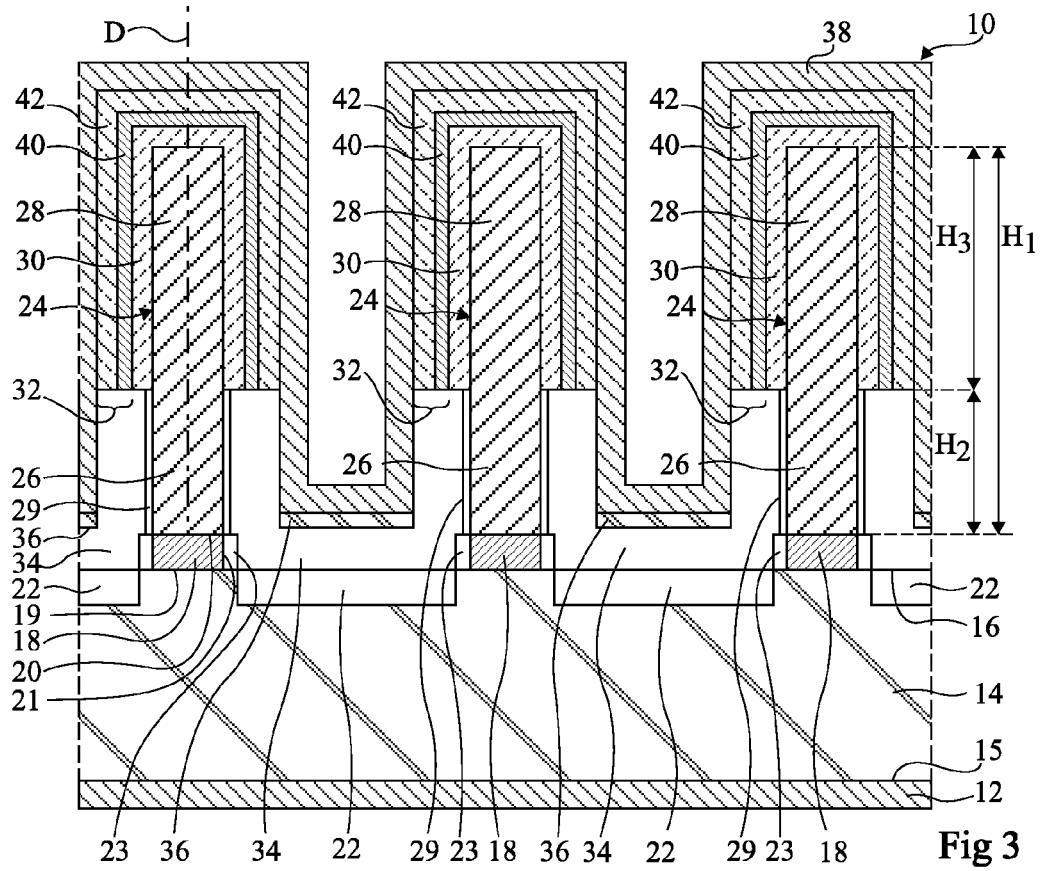
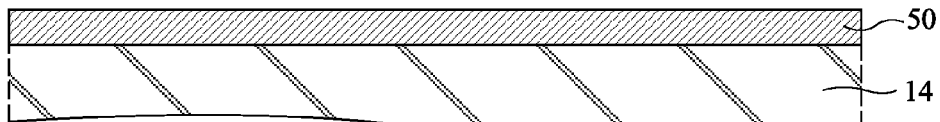
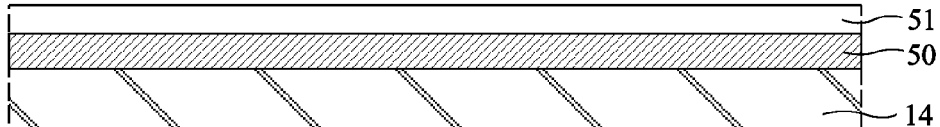
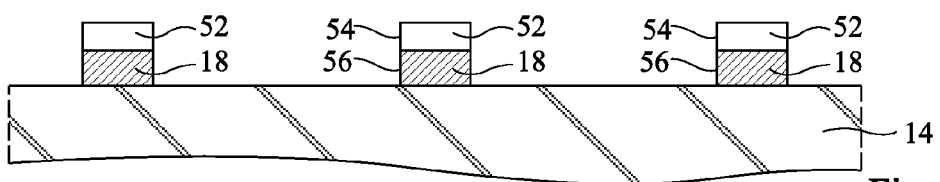
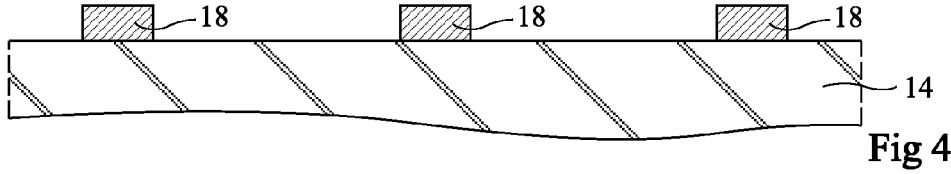

OPTOELECTRONIC DEVICE AND METHOD FOR MANUFACTURING SAME

CROSS REFERENCE TO RELATED APPLICATIONS

The present patent application is the national stage application under 35 U.S.C. §371 of International Application No. PCT/FR2013/052551 filed Oct. 25, 2013 with priority claim to French patent application FR13/52794 and French patent application FR12/60232 the entire disclosures of which are incorporated herein by reference in their entireties.

BACKGROUND

The present invention generally relates to semiconductor materials, to devices based on semiconductor materials, and to their manufacturing methods. The present invention more specifically relates to devices comprising three-dimensional elements, and especially semiconductor microwires or nanowires.

DISCUSSION OF THE RELATED ART

Microwires or nanowires based on a compound mainly containing a group-III element and a group-V element (for example, gallium nitride GaN), called III-V compound hereafter, or mainly containing a group-II element and a group-VI element (for example, zinc oxide ZnO), called II-VI compound hereafter, are examples of microwires or nanowires comprising a semiconductor material. Such microwires or nanowires enable to manufacture semiconductor devices such as optoelectronic devices. The term "optoelectronic devices" is used to designate devices capable of converting an electric signal into an electromagnetic radiation or the other way, and especially devices dedicated to the detection, the measurement, or the emission of an electromagnetic radiation or devices dedicated to photovoltaic applications.

Methods for manufacturing semiconductor material microwires or nanowires should enable to manufacture microwires or nanowires with an accurate and uniform control of the geometry, of the position, and of the crystallographic properties of each microwire or nanowire.

Document U.S. Pat. No. 7,829,443 describes a method for manufacturing nanowires, comprising the deposition of a layer of a dielectric material on a planar surface of a substrate, the etching of openings in the dielectric material layer to expose portions of the substrate, the filling of the openings with portions of a material promoting the growth of nanowires, and the forming of nanowires in the openings on these portions. The dielectric material is selected so that nanowires do not directly grow thereon.

In microwires or nanowires, to have the best possible properties of conversion of an electric signal into an electromagnetic radiation or of an electromagnetic radiation into an electric signal, it is desirable for each microwire or nanowire to substantially have a single-crystal structure. In particular, when the microwires or nanowires are mainly formed of a material based on a first element and on a second element, for example, III-V or II-VI compounds, it is desirable for each microwire or nanowire to substantially have a constant polarity all along the microwire or nanowire.

However, with the method disclosed in U.S. Pat. No. 7,829,443, the nanowire growth may be disturbed, so that each nanowire might not have a single-crystal structure. In particular, when the nanowires are mainly formed of a material based on a first element and on a second element, for example, III-V or II-VI compounds, a peripheral layer having a reverse polarity with respect to the polarity in the nanowire core may appear on the nanowire sides.

This may cause the forming of defects, especially at grain boundaries, which may alter the efficiency of the conversion of an electric signal into an electromagnetic radiation or the other way.

SUMMARY

Thus, an object of an embodiment is to overcome at least part of the disadvantages of optoelectronic devices, particularly with microwires or nanowires, and of their previously-described manufacturing methods.

Another embodiment provides not to form three-dimensional elements, especially semiconductor material microwires or nanowires through openings made in a dielectric material layer.

Another embodiment provides that each three-dimensional element, especially each microwire or nanowire, made of semiconductor material, substantially has a single-crystal structure.

Another embodiment provides the possibility of accurately and uniformly controlling the position, the geometry, and the crystallographic properties of each three-dimensional element, especially of each microwire or nanowire, made of semiconductor material.

Another embodiment provides the possibility of forming the three-dimensional elements, and especially the microwires or nanowires, made of semiconductor material, at an industrial scale and at low cost.

Thus, an embodiment provides an optoelectronic device comprising:

a substrate;

pads on a surface of the substrate;

semiconductor elements, each element resting on a pad; and a portion covering at least the lateral edges of each pad, said portion preventing the growth of the semiconductor elements on the lateral sides.

According to an embodiment, the device further comprises a dielectric region extending in the substrate from said surface and connecting, for each pair of pads, one of the pads in the pair to the other pad in the pair.

According to an embodiment, the substrate is made of a first semiconductor material selected from the group comprising silicon, germanium, silicon carbide, a III-V compound, a II-VI compound, and a combination of these compounds.

According to an embodiment, each semiconductor element comprises at least a portion mainly comprising a second semiconductor material in contact with one of the pads, the second semiconductor material being selected from the group comprising silicon, germanium, silicon carbide, a III-V compound, a II-VI compound, and a combination of these compounds.

According to an embodiment, the thickness of each pad is in the range from 1 nm to 100 nm and the substrate is in electric contact with each pad.

According to an embodiment, each semiconductor element is a microwire, a nanowire, a conical element, or a tapered element.

An embodiment also provides a method of manufacturing an optoelectronic device, comprising the successive steps of:
  providing a substrate;
  forming pads on a surface of the substrate;
  forming a portion covering at least the lateral sides of each pad; and
  forming semiconductor elements, each element resting on a pad, said portion comprising a material preventing the growth of the semiconductor elements on the lateral sides.

According to an embodiment, the portion is made of an insulating material.

According to an embodiment, the step of forming the portion comprises the step of forming a dielectric area extending on the surface between the pads and coming into contact with the lateral sides.

According to an embodiment, the step of forming the dielectric area comprises the steps of:
  depositing a first dielectric layer of a first dielectric material on the substrate and on the pads, the first dielectric layer forming bumps on the pads;
  depositing, on the first dielectric layer, a second dielectric layer of a second dielectric material different from the first dielectric material;
  removing, by chem.-mech. polishing, the second dielectric layer to expose the bumps of the first dielectric layer; and
  etching the first dielectric layer and the remaining portions of the second dielectric layer to expose the tops of the pads.

According to an embodiment, the method further comprises forming a dielectric region extending in the substrate from said surface and connecting, for each pair of pads, one of the pads in the pair to the other pad in the pair.

According to an embodiment, the region is formed by oxidation or nitriding of the substrate.

According to an embodiment, the method comprises the successive steps of:
  depositing a layer on the substrate;
  forming insulating blocks on the layer;
  etching the portions of the layer which are not covered with the insulating blocks to form the pads;
  oxidizing the sides of the pads and the substrate portions which are not covered with the pads; and
  removing the insulating blocks.

According to an embodiment, the method comprises the successive steps of:
  depositing a layer on the substrate;
  forming insulating blocks on the layer;
  etching the portions of the layer which are not covered with the insulating blocks to form the pads;
  removing the insulating blocks;
  depositing a dielectric layer covering the pads and the substrate between the pads; and
  anisotropically etching the dielectric layer to remove the dielectric layer from the substrate and from the top of the pads and leave the portions of the dielectric layer on the lateral sides;
  nitriding the portions of the substrate which are not covered with the pads, and possibly the tops of the pads.

BRIEF DESCRIPTION OF THE DRAWINGS

The foregoing and other features and advantages will be discussed in detail in the following non-limiting description of specific embodiments in connection with the accompanying drawings, among which:

FIG. 3 is a partial simplified cross-section view of an embodiment of an optoelectronic device comprising microwires or nanowires;

FIGS. 4A to 4I are partial simplified cross-section views of the structures obtained at successive steps of another embodiment of a method of manufacturing the optoelectronic device of FIG. 3;

DETAILED DESCRIPTION

Figure 1A:
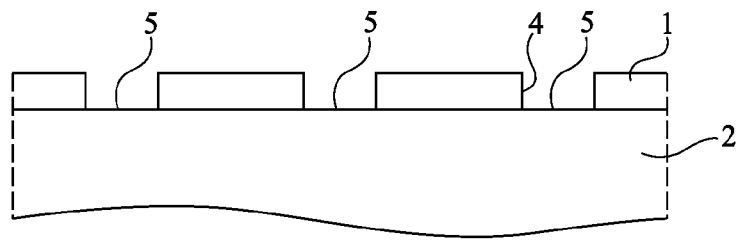
FIGS. 1A to 1C are partial simplified cross-section views of the structures obtained at successive steps of a known method of manufacturing an optoelectronic device comprising microwires or nanowires.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the optoelectronic device control means described hereafter are within the abilities of those skilled in the art and are not described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferably greater than 99%.

The present invention relates to the manufacturing of three-dimensional elements, for example, microwires, nanowires, or pyramid-shaped elements. In the following description, embodiments are described for the manufacturing of microwires or nanowires. However, these embodiments may be implemented for the manufacturing of three-dimensional elements other than microwires or nanowires, for example, for the manufacturing of pyramid-shaped three-dimensional elements.

Term "microwire" or "nanowire" designates a three-dimensional structure having an elongated shape along a preferred direction, having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest of the minor dimensions. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferential direction of the wire, is substantially rectilinear and is called "axis" of the wire hereafter.

The cross-section of the wires may have different shapes, such as, for example, an oval, circular, or polygonal shape, particularly triangular, rectangular, square, or hexagonal. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section.

The wires may at least partly be formed made of at least one semiconductor material. The semiconductor material may be silicon, germanium, silicon carbide, a III-V compound, a II-VI compound, or a combination of these compounds.

The wires may be at least partly formed of semiconductor materials mainly comprising a III-V compound, for example, III-N compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

The wires may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group—VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

In certain embodiments, the wires may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The wires are formed on a substrate. The substrate may correspond to a one-piece structure or correspond to a layer covering a support made of another material. The substrate for example is a semiconductor substrate such as a substrate made of silicon, germanium, silicon carbide, a III-V compound, such as GaN or GaAs, or a ZnO substrate. The substrate may be made of a conductive material, for example, of metal, or of an insulating material, for example, of sapphire, glass, or ceramic.

The principle of the invention is to form, on a surface of a substrate, pads or islands, also called seed islands hereafter, of a material promoting the growth of wires and to then carry out a treatment for protecting the lateral sides of the seed islands and of the surface of the substrate portions which are not covered with the seed islands to form a protection region unfit for the growth of wires, for example, a dielectric region, on the lateral edges of the seed islands and extending on top and/or inside of the substrate and connecting, for each pair of pads, one of the pads in the pair to the other pad in the pair, with no growth of the wires on the protection region.

Saying that a compound based on at least one first element and on a second element has a polarity of the first element and a polarity of the second element means that the material grows along a preferred direction and that when the material is cut in a plane perpendicular to the preferred growth direction, the exposed surface essentially comprises atoms of the first element in the case of the polarity of the first element or of the atoms of the second element in the case of the polarity of the second element.

The material forming the seed islands is selected to promote the wire growth according to the same polarity. As an example, when the wires mainly comprise a III-V compound, the material forming the seed islands is preferably selected to promote the growth of the III-V compound according to the polarity of the group-V element. The III-V compound then grows along the polarity of the group-V element on the seed islands, from the top of each seed islands, and grows neither on the lateral sides of the seed islands nor on the rest of the substrate. Further, the inventors have shown that each wire then grows according to a substantially constant polarity in the entire wire. When the wires mainly comprise a II-VI compound, the material forming the seed islands is preferably selected to promote the growth of the II-VI compound according to the polarity of the group-VI element. The II-VI compound then grows according the polarity of the group-VI element on the seed islands, from the top of each seed islands, and grows neither on the lateral sides of the seed islands nor on the rest of the substrate.

In the case of a III-V compound where the group-V element is nitrogen, the material forming the islands may be a material promoting the growth of a wire according to the N polarity. As an example, the islands may be made of aluminum nitride (AlN), boron (B), boron nitride (BN), titanium (Ti), titanium nitride (TiN), tantalum (Ta), tantalum nitride (TaN), hafnium (Hf), hafnium nitride (HfN), niobium (Nb), niobium nitride (NbN), zirconium (Zr), zirconium borate (ZrB$_2$), zirconium nitride (ZrN), silicon carbide (SiC), tantalum carbo-nitride (TaCN), magnesium nitride in Mg$_x$N$_y$ form, where x is approximately equal to 3 and y is approximately equal to 2, for example, magnesium nitride in Mg$_3$N$_2$ form or magnesium gallium nitride (MgGaN), tungsten (W), tungsten nitride (WN), platinum (Pt), platinum nitride (PtN), or a combination thereof and of their nitrided compounds. Preferably, the material forming the seed islands is aluminum nitride.

The wire growth method may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metalorganic MBE (MOMBE), plasma-assisted MBE (PAMBE), atomic layer epitaxy (ALE), or hydride vapor phase epitaxy (HVPE) may be used. However, electrochemical processes may be used, for example, chemical bath deposition (CBD), hydrothermal processes, liquid aerosol pyrolysis, or electrodeposition.

As an example, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia (NH$_3$), tertiarybutylphosphine (TBT), arsine (AsH$_3$), or unsymmetrical dimethylhydrazine (UDMH).

According to an embodiment of the invention, in a first phase of growth of the wires of the III-V compound, a precursor of an additional element is added in excess, in addition to the precursors of the III-V compound. The additional element may be silicon (Si). An example of a precursor of silicon is silane (SiH$_4$).

Figure 1B:
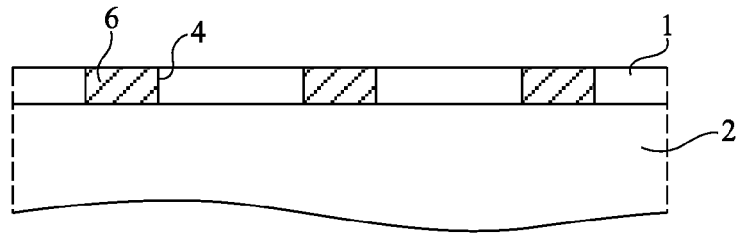
Figure 1C:
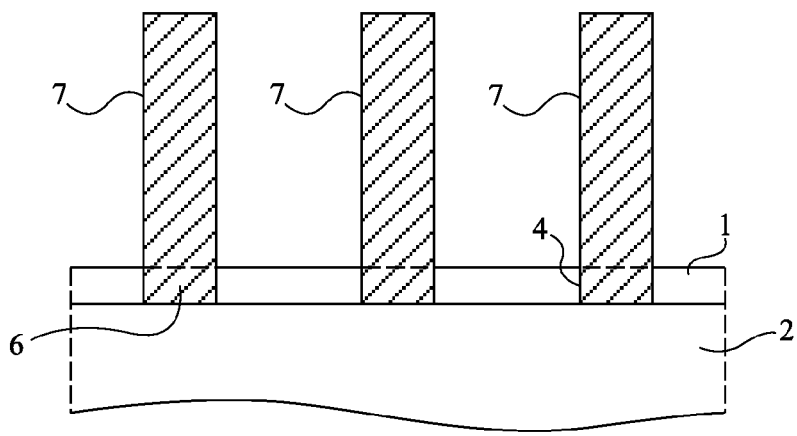

FIGS. 1A to 1C illustrate the structures obtained at successive steps of an example of a known method of manufacturing an optoelectronic device comprising microwires or nanowires.

(i) A layer 1 of a dielectric material is deposited on a substrate 2 and openings 4 are etched in layer 1, openings 4 exposing certain portions 5 of substrate 2 (FIG. 1A).

(ii) Portions 6 of a material promoting the growth of wires in openings 4 are grown (FIG. 1B).

(iii) A wire 7 is grown on each portion 6 (FIG. 1C).

Figure 2:
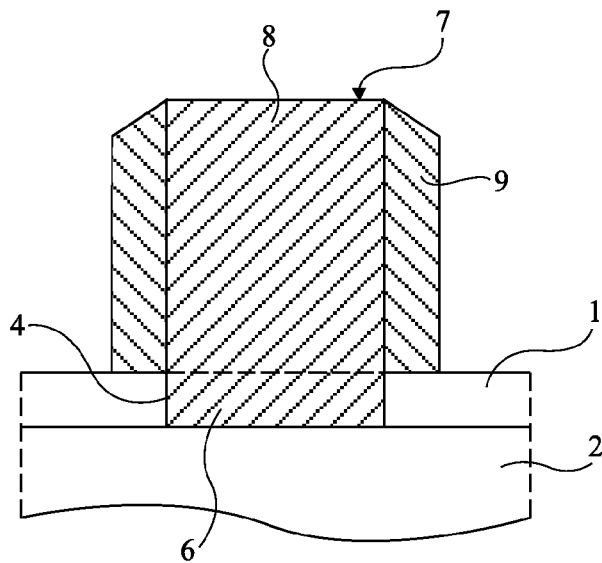
FIG. 2 is a partial simplified detail cross-section view of a microwire or nanowire obtained by the method described in relation with FIGS. 1A to 1C.

FIG. 2 is a detail view of one of wires 7 shown in FIG. 1C.

The inventors have shown that when the method previously described in relation with FIGS. 1A to 1C is implemented for the forming of wires of a semiconductor material based on a compound of a first element and of a second element, this results in the forming of a wire 7 comprising a single-crystal core 8, having the polarity of the first element, surrounded with a single-crystal peripheral layer 9 having the polarity of the second element. This may cause the occurrence of defects at the interface between layer 9 and core 8.

An explanation would be that the presence of dielectric layer 1 disturbs the forming of portion 6, which causes the forming of layer 9 when wire 7 grows from underlying portion 6.

FIG. 3 is a partial simplified cross-section view of an embodiment according to the invention of an optoelectronic device 10 formed from wires such as previously described and capable of emitting an electromagnetic radiation.

Device 10 comprises, from bottom to top in FIG. 3:
a first biasing electrode 12;
a substrate (for example, semiconductor) 14 comprising opposite surfaces 15 and 16, surface 15 being in contact with electrode 12;
seed islands 18 promoting the growth of wires and arranged on surface 16, each island 18 comprising a lower surface 19 in contact with surface 16 of substrate 14, an upper surface 20, opposite to surface 19, and at a distance from surface 19 and from lateral surfaces 21, or lateral sides, connecting lower surface 19 to upper surface 20;
a region 22 in substrate 14, extending between each pair of islands 18 from surface 16 across a portion of the depth of substrate 14, region 22 being formed of a dielectric, resulting from the substrate transformation, which protects the underlying substrate and prevents the growth of wires;
protection portions 23, of a material unfit for the growth of wires, covering lateral surfaces 21 and surrounding each island 18, protection portions 23 preventing the growth of wires;
wires 24 (three wires being shown) of height H$_1$, each wire 24 being in contact with surface 20 of one of islands 18, each wire 24 comprising a lower portion 26, of height H$_2$, in contact with island 18 and an upper portion 28, of height H$_3$, in contact with lower portion 26;
a passivating layer 29 covering the periphery of each lower portion 26;
an active layer 30 covering each upper portion 28;
one semiconductor layer 32 or more covering each active layer 30;
insulating portions 34 covering surface 16 between wires 24 and each wire 24 along at least height H$_2$;
a reflective portion 36 covering insulating portions 34 between wires 24; and
a second electrode layer 38 covering semiconductor layers 32 and insulating portions 34.

Substrate 14 for example is a semiconductor substrate, such as a silicon substrate. Substrate 14 may be doped with a first conductivity type, for example, N-type doped. Surfaces 15 and 16 may be planar and parallel. Surface 16 of substrate 14 may be a <100> surface.

Electrode 12 may correspond to a conductive layer which extends on surface 15 of substrate 14. The material forming electrode 12 is, for example, nickel silicide (NiSi), aluminum (Al), aluminum silicide (AlSi), titanium (Ti), or titanium silicide (TiSi). This layer may be covered with another metal layer, for example, gold, copper, or eutectics (Ti/Ni/Au or Sn/Ag/Cu) in the case of a soldering.

Islands 18 for example have a thickness in the range from 1 to 100 nanometers, preferably in the range from 10 to 60 nanometers. Islands 18 are located on surface 16 so that they protrude from surface 16. Top 20 of each island 18 is thus in a different plane than surface 16. Each island 18 has a preferred texturing and, when the material forming each island comprises an alloy of at least two elements, a preferred polarity. Preferred texturing means that the crystals forming islands 18 have a preferred growth direction, which is the same for all islands 18. Preferred polarity means that islands 18 all substantially have the same polarity. This means that when the material forming each island comprises an alloy of at least two elements, when the material is cut in a plane perpendicular to the preferred growth direction of the material, the exposed surface essentially comprises atoms of the same element for each island 18. Each island 18 may have the same conductivity type as substrate 14 to limit the interface resistance between islands 18 and substrate 14. Each island 18 may have any type of shape, for example rectangular, polygonal, circular, square, or oval. Preferably, the mean diameter of seed island 18 is of the same order of magnitude as the mean diameter of wire 20 intended to grow on seed island 18.

Protection portions 23 may be made of a material deposited on sides 21 of seed islands 18. The material may be conformally deposited, for example, by CVD. It for example is silicon oxide (SiO$_2$), silicon nitride (Si$_x$N$_y$, where x is approximately equal to 3 and y is approximately equal to 4, for example, Si$_3$N$_4$), aluminum oxide (Al$_2$O$_3$), hafnium oxide (HfO$_2$), or diamond. Protection portions 23 may further be made of a dielectric material resulting from the transformation of the material forming seed islands 18. The material forming protection portions 23 may then correspond to an oxide of the examples of materials of previously-described seed islands 18. As an example, the thickness of insulating portions 23 is in the range from 5 nm to 100 nm, for example, equal to approximately 30 nm.

Regions 22 may partly extend under islands 18. Region 22 may partially extend under certain islands 18 or under each island 18. However, semiconductor substrate 14 should remain in electric contact with each island 18. The forming conditions of regions 22 are thus selected so that regions 22 extend at most along a length shorter than half the greatest length of the wire cross-section. As an example, the depth of each region 22 is in the range from 5 nm to 100 nm, for example, 10 nm.

The centers of two adjacent islands 18 may be distant by from 0.5 μm to and preferably from 1.5 μm to 4 μm. As an example, islands 18 may be regularly distributed on substrate 14, region 22 forming a grid surrounding each island 18. As an example, islands 18 may be distributed in a hexagonal network.

Each wire 24 is an elongated semiconductor structure along an axis D substantially perpendicular to surface 16. Each wire 24 may have a general elongated cylindrical shape with a hexagonal base. The mean diameter of each wire 24 may be in the range from 50 nm to 2.5 μm and height $H_1$ of each wire 24 may be in the range from 250 nm to 50 μm.

Lower portion 26 of each wire 24 is mainly formed of the III-N compound, for example, gallium nitride, doped with a first conductivity type, for example, with silicon. The periphery of lower portion 26 is covered with dielectric layer 29, for example SiN, up to height $H_2$ from the end of lower portion 26 in contact with the associated island 18. Height $H_2$ may be in the range from 100 nm to 25 μm. Dielectric material layer 29 has a thickness between one atomic monolayer and 100 nm, preferably between one atomic monolayer and 10 nm.

Upper portion 28 of each wire 24 is for example at least partly made of a III-N compound, for example, GaN. Upper portion 28 may be doped with the first conductivity type, for example, type N, or may not be intentionally doped. Upper portion 28 extends up to height $H_3$ which may be in the range from 100 nm to 25 μm.

In the case of a wire mainly made of GaN, the crystal structure of the wire may be of wurtzite type, the wire extending along axis C. The crystal structure of the wire may also be of cubic type.

Active layer 30 is the layer from which most of the radiation provided by device 10 is emitted. According to an example, active layer 30 may comprise confinement means, such as multiple quantum wells. It is for example formed of an alternation of GaN and of InGaN layers having respective thicknesses from 5 to 20 nm (for example, 8 nm) and from 1 to 10 nm (for example, 2.5 nm). The GaN layers may be doped, for example of type N or P. According to another example, the active layer may comprise a single InGaN layer, for example, having a thickness greater than 10 nm.

Semiconductor layer 32 enables to form a P-N or P-I-N junction with active layer 30 and/or upper portion 28. It enables to inject holes into active layer 30 via electrode 38.

The stack of semiconductor layers 32 may comprise an electron barrier layer 40 formed of a ternary alloy, for example, made of aluminum gallium nitride (AlGaN) or of aluminum indium nitride (AlInN) in contact with active layer 30 and an additional layer 42, to provide a good electric contact between second electrode 38 and active layer 30, for example, made of gallium nitride (GaN) in contact with electronic barrier layer 40 and with electrode 38. Semiconductor layer 42 is doped with the conductivity type opposite to that of portion 28, for example, P-type doped. Electron barrier layer 40 may be of the same conductivity type as semiconductor layer 42.

Insulating portions 34 are capable of preventing the forming of a direct electric contact between lower portion 26 of each wire 24 and electrode 38. Insulating portions 34 may be conformally arranged, for example, by CVD. Insulating portions 34 may be of a dielectric material, for example, silicon oxide ($SiO_2$), silicon nitride ($Si_xN_y$, where x is approximately equal to 3 and y is approximately equal to 4, for example, $Si_3N_4$), aluminum oxide ($Al_2O_3$), hafnium oxide ($HfO_2$), or diamond.

Reflective portions 36 are for example made of aluminum, of silver, or of ruthenium and for example have a thickness greater than 100 nm.

Second electrode 38 is capable of both biasing active layer 30 of each wire 24 and of letting through the electromagnetic radiation emitted or received by wires 24. The material forming electrode 38 may be a transparent and conductive material such as indium-tin oxide (or ITO), aluminum zinc oxide, or graphene.

In the present embodiment, wires 24 are formed on islands 18 which are separate elements distributed on substrate 14. If the wires were formed on a layer covering substrate 14, the fact for the layer and substrate 14 to be made of different materials having different thermal expansion coefficients would cause the occurrence of mechanical stress in the optoelectronic device during the manufacturing thereof. The present embodiment advantageously enables to avoid the occurrence of mechanical stress in islands 18 and substrate 14 due to the difference in thermal expansion coefficients between the materials forming islands 18 and substrate 14.

If lateral sides 21 of seed islands 18 were not covered with a material unfit for the growth of wires, they would be privileged growth sites. The presence of clear lateral sides 21 could then give rise to parasitic growths, for example the growth of a plurality of wires on lateral sides 21 in addition to the wire on surface 20, or the growth of wires having an axis non-perpendicular to surface 20 of seed island 18. In the present embodiment, since sides 21 of seed islands 18 are covered with a material unfit for the growth of wires, the growth of wires 24 only occurs from top 20 of each island 18. Risks of growth of one or a plurality of wires 24 in directions different from the normal to surface 20 from a same island 18 are thus decreased.

FIGS. 4A to 4I illustrate the structures obtained at successive steps of an embodiment of a method of manufacturing optoelectronic device 10 of FIG. 3.

The embodiment of the manufacturing method according to the present invention comprises the steps of:

(1) Depositing on substrate 14 a uniform layer 50 of the material promoting the growth of the III-N compound, for example according to the N polarity (FIG. 4A). It may be aluminum nitride. Layer 50 has, for example, a thickness in the range from 1 nm to 100 nm, preferably from 10 nm to 60 nm. Layer 50 may be obtained by a MOCVD-type method. However, methods such as CVD, MBE, GSMBE, MOMBE, ALE, HVPE, ALD (Atomic Layer Deposition), evaporation, or reactive cathode sputtering may be used, as well as any deposition type providing a textured layer. When layer 50 is made of aluminum nitride, layer 50 should be substantially textured and have a preferred polarity. The texturing of layer 50 may be obtained by an additional treatment carried out after the deposition of layer 50. It for example is an anneal under an ammonia flow ($NH_3$).

(2) Depositing a layer 51 of a dielectric material on layer 50 (FIG. 4B). Layer 51 is made of a dielectric material which may be selectively etched over the material forming layer 50. The dielectric material is, for example, silicon nitride (for example, $Si_3N_4$). Dielectric layer 51 for example has a thickness in the range from 50 to 300 nm, for example, approximately 100 nm.

(3) Etching openings 54 in dielectric layer 51 to form portions 52, or blocks, of dielectric layer 51 and expose areas of layer 50 and etching opening 56 in layer 50 above the exposed portions of layer 50 to form islands 18 (FIG. 4C). The etching of openings 54 may be carried out by a step of selective etching which causes no etching of layer 50. It may be an etching using a sulfur hexafluoride plasma ($SF_6$). The etching of openings 56 may correspond to a dry or wet etching stopping on top of/inside of substrate 14. As a variation, the etching of openings 56 may be a reactive ion etching or RIE, an inductively-coupled plasma or ICP etching, or a wet etching.

(4) Removing portions 52 (FIG. 4D). The removal of portions 52 of the dielectric layer may be carried out by a selective etch step which causes no etching of pads 18 and of substrate 14. It may be an etching using a sulfur hexafluoride plasma ($SF_6$) or a chlorinated plasma, or a BOE-type (Buffered Oxide Etch) wet etching using a mixture of ammonium fluoride ($NH_4F$) and of hydrofluoric acid (HF).

Figure 4E:
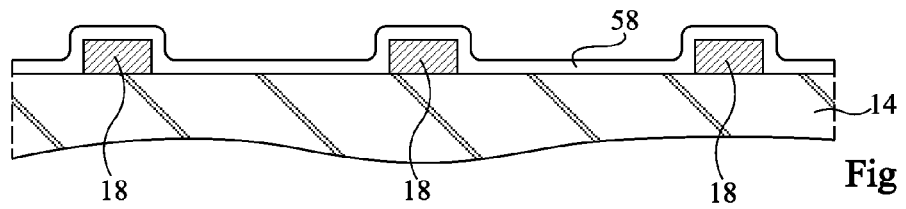

(5) Depositing a layer 58 of a material unfit for wire growth, for example, a dielectric material, on islands 18 and on substrate 14 (FIG. 4E). This preferably is a conformal or substantially conformal deposition. Layer 58 is made of a material which may be selectively etched over the material forming islands 18 and substrate 14. Layer 58 is for example made of silicon nitride (for example, $Si_3N_4$), of silicon oxide ($SiO_2$), or of a silicide of the materials previously described for the forming of seed islands 18. Layer 58 has, for example, a thickness at least equal to one third of the thickness of seed islands 18, and, in particular, a thickness in the range from 5 nm to 200 nm, for example, equal to approximately 100 nm.

Figure 4F:
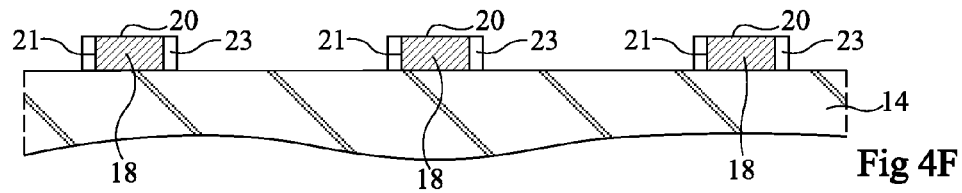

(6) Anisotropically etching layer 58 to remove the portions of layer 58 covering substrate 14 and tops 20 of islands 18 and keep portions 23 of layer 58 covering lateral sides 21 of islands 18 (FIG. 4F). This etching is selective over the material forming substrate 14 and the material forming seed islands 18. It for example is an ion etching or a reactive ion etching.

(7) Forming region 22 by a method of nitriding the exposed areas of substrate 14 (FIG. 4G) which are not covered with islands 18. Region 22 is essentially made of silicon nitride. The obtained silicon nitride depth should be sufficient to prevent any attack of the group-III element, for example, gallium, against the material forming substrate 14. The depth of region 22 may be in the range from 5 nm to 100 nm, preferably greater than or equal to 10 nm. Region 22 may partly extend under islands 18. The nitriding conditions are selected so that substrate 14 however remains in electric contact with each island 18. Further, an overthickness may appear at the level of region 22. The nitriding step may be carried out with ammonia in a dedicated furnace or in an epitaxy reactor. The nitriding temperature may vary from 900 to 1,100° C. and the nitriding time may vary from a few minutes to one hour. A nitriding of tops 20 of islands 18 propitious for the subsequent growth of lower portions 26 of wires 24 is further obtained. The nitriding method may be carried out in a plurality of steps. As an example, in particular, when the islands are made of aluminum (possibly doped with silicon), the nitriding step may comprise a first nitriding phase which may be carried out at a first temperature, for example, in the range between 400 and 750° C., followed by a second nitriding phase carried out at a second temperature strictly greater than the first temperature, for example, in the range from 800 to 1,100° C. The first phase promotes the nitriding of top 20 of each island 18 while the second phase promotes the nitriding of the portions of substrate 14 which are not covered with islands 18.

Figure 4G:
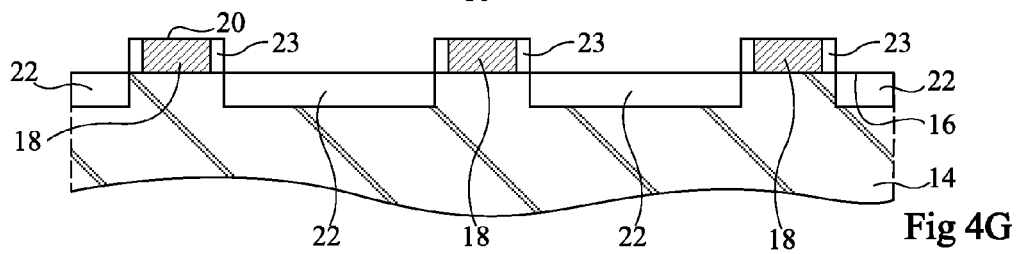
Figure 4H:
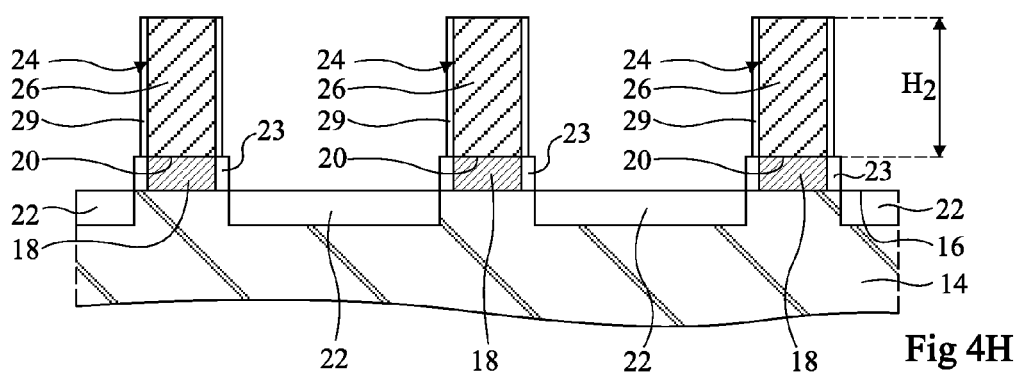
Figure 4I:
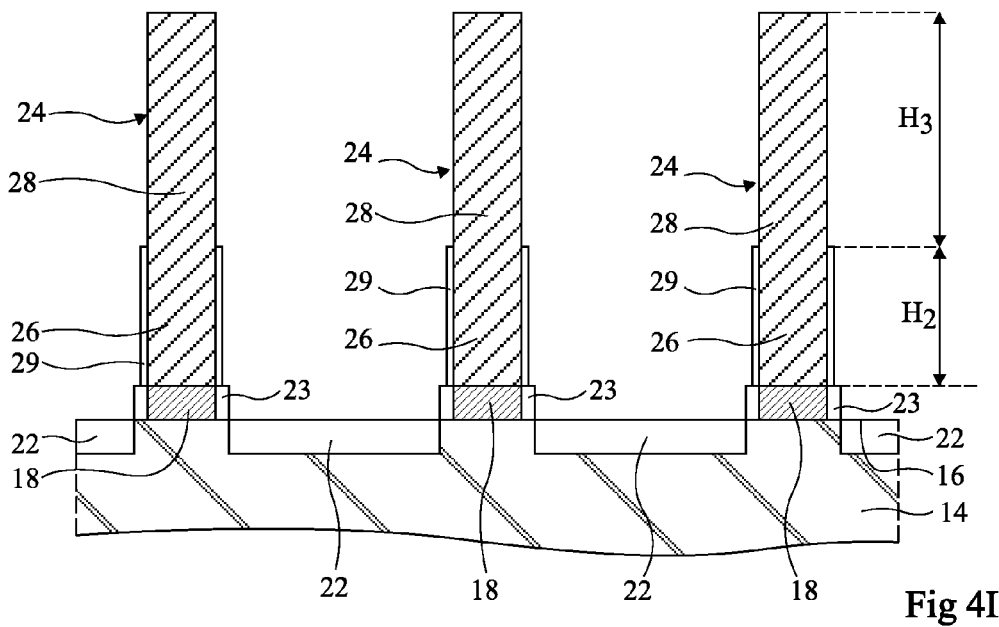

(8) Growing passivated portion 26 of each wire 24 up to height $H_2$ (FIG. 4H). Each wire 24 grows from surface 20 at the top of a seed island 18. Lower portion 26 of each wire 24 may be obtained by a MOCVD-type method. However, methods such as CVD, MBE, GSMBE, MOMBE, PAMBE, ALE, HVPE, or electrochemical methods may be used.

As an example, in the case where upper portion 26 is made of heavily-doped N-type GaN, a MOCVD-type method may be implemented by injection, into a showerhead-type MOCVD reactor, of a gallium precursor gas, for example, trimethylgallium (TMGa) and a nitrogen precursor gas, for example, ammonia ($NH_3$). As an example, a showerhead-type 3×2" MOCVD reactor commercialized by AIXTRON, may be used. A molecular flow ratio between trimethylgallium and ammonia within the 5-200 range, preferably within the 10-100 range, enables to promote the growth of wires. As an example, a carrier gas which ensures the diffusion of metal-organic elements all the way into the reactor charges with metal-organic elements in a TMGa bubbler. The latter is adjusted according to the standard operating conditions. A flow of 60 sccm (standard cubic centimeters per minute) is for example selected for TMGa, while a 300-sccm flow is used for $NH_3$ (standard $NH_3$ bottle). A pressure of approximately 800 mbar (800 hPa) is used. The gaseous mixture further comprises silane injected into the MOCVD reactor, which material is a precursor of silicon. The silane may be diluted in hydrogen at 1,000 ppm and a 20-sccm flow is provided. The temperature in the reactor is for example in the range from 950° C. to 1,100° C., preferably from 990° C. to 1,060° C. To transport species from the outlet of the bubblers to the two reactor plenums, a 2,000-sccm flow of carrier gas, for example, $N_2$, distributed between the two plenums, is used. The previously-indicated gas flows are given as an indication and should be adapted according to the size and to the specificities of the reactor.

The presence of silane among the precursor gases results in an incorporation of silicon within the GaN compound. Further, this results in the forming of silicon nitride layer 29 which covers the periphery of portion 26 of height $H_2$, except for the top, along the growth of portion 26.

(9) Growing upper portion 28 of height $H_3$ of each wire 24 (FIGS. 4I) on the top of lower portion 26. For the growth of upper portion 28, the previously-described MOCVD reactor operating conditions are, as an example, maintained but for the fact that the silane flow in the reactor is decreased, for example, by a factor greater than or equal to 10, or stopped. Even when the silane flow is stopped, an active portion may be N-type doped due to the diffusion in this active portion of dopants originating from the adjacent passivated portions or due to the residual doping of GaN.

The method comprises the additional steps of:

(10) Forming, for each wire 24, active layer 30 by epitaxy. Given the presence of passivating portion 23 on lateral sides 21 of seed island 18 and of passivating portion 29 covering the periphery of lower portion 26, the deposition of active layer 30 only occurs on the upper portion 28 of wire 24;

(11) Forming by epitaxy, for each wire 24, electron barrier layer 40 and semiconductor layer 42;

(12) Forming insulating portions 34. Insulating portions 34 may be formed by conformally depositing an insulating layer over the entire structure, depositing a resin layer between wires 24, etching the insulating layer which is not covered with the resin to expose semiconductor layer 42, and remove the resin.

(13) Forming reflective portions 36; and

(14) Forming electrodes 38 and 12.

Figure 5A:
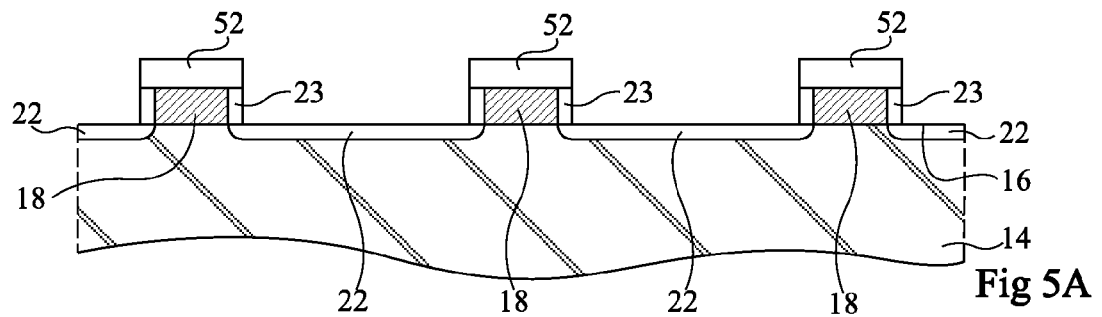
FIGS. 5A to 5B are partial simplified cross-section views of the structures obtained at successive steps of another embodiment of a method of manufacturing the optoelectronic device of FIG. 3.
Figure 5B:
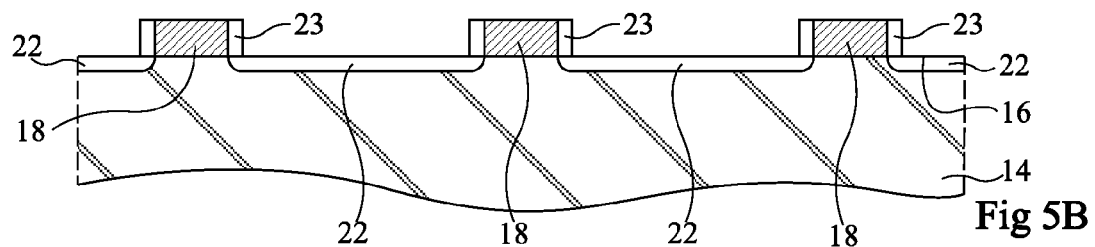

FIGS. 5A and 5B illustrate steps (4)' and (5)' of another embodiment of a method of manufacturing optoelectronic device 10 shown in FIG. 3 and replace steps (4) to (7) previously described in relation with FIGS. 4D to 4G, the other steps (1) to (3) and (8) to (14) being identical to those previously described. Steps (4)' and (5)' are the following:

(4)' Forming portions 23 and region 22 by a method of thermal oxidation of the exposed areas of substrate 14 and of seed islands 18 (FIG. 5A). Portions 23 are essentially made of oxide of the materials forming previously-described seed islands 18. Region 22 is essentially made of silicon dioxide ($SiO_2$) and when seed islands 18 are made of aluminum nitride, portions 23 are essentially made of aluminum oxide. The obtained depth of silicon oxide region 22 should be sufficient to prevent any attack of the group-III element, for example, gallium, against the material forming substrate 14. The depth of region 22 may be in the range from 5 nm to 100 nm, preferably greater than or equal to 10 nm. Portions 23 have a thickness in the range from 5 nm to 100 nm, for example, equal to approximately 10 nm.

Dielectric region 22 and dielectric portions 23 may be formed in a high-temperature furnace. The oxidation step may be carried out with oxygen or with water vapor. As an example, the oxidation temperature varies from 750 to 1,100° C. for oxidation periods varying from a few minutes to one hour. During the step of forming region 22 and portions 23, portions 52 protect top 20 of each island 18 against the oxidation treatment. Region 22 may partly extend under islands 18. The oxidation conditions are selected so that substrate 14 however remains in electric contact with each island 18. Further, an overthickness may appear at the level of region 22.

(5)' Removing portions 52 of dielectric layer 51 (FIG. 5B). The material forming portions 52 is selected to be selectively etched over the materials forming seed islands 18, dielectric region 22, and dielectric portions 23. As an example, the material forming portions 52 is silicon nitride. This may be carried out by a step of selective etching which causes no etching of pads 18, of portions 23, and of regions 22. It may be an etching using a sulfur hexafluoride plasma ($SF_6$).

Figure 6:
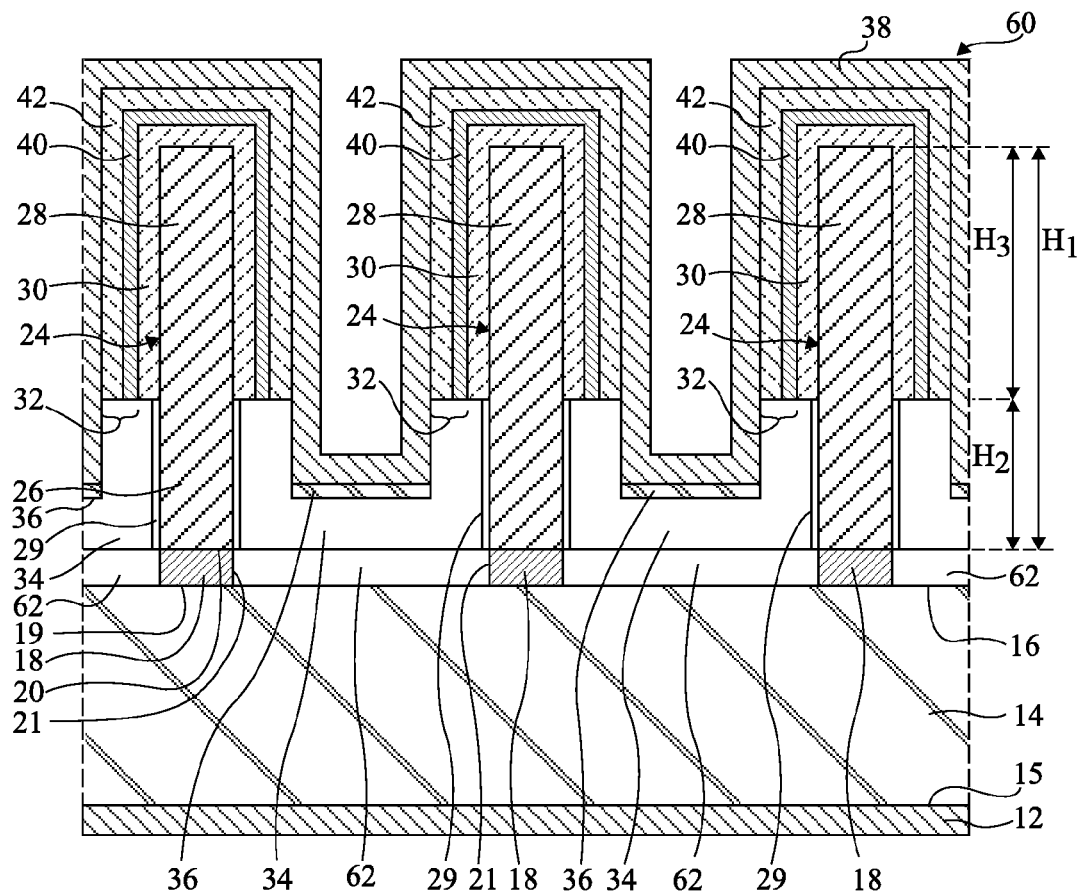
FIG. 6 is a partial simplified cross-section view of another embodiment of an optoelectronic device comprising microwires or nanowires.

FIG. 6 is a partial simplified cross-section view of another embodiment of an optoelectronic device 60 formed from wires 24 such as previously described and capable of emitting an electromagnetic radiation. Device 60 differs from device 10 in that insulating regions 22 extending in substrate 14 and protection portions 23 on lateral sides 21 of seed islands 18 of device 10 are replaced with an insulating area 62 formed on surface 16 of substrate 14 and extending between islands 18 to come into contact with lateral sides 21 of islands 18. The dielectric material forming insulating area 62 is for example silicon nitride (for example, $Si_3N_4$). Insulating area 62 for example has substantially the same height as seed islands 18.

Figure 7A:
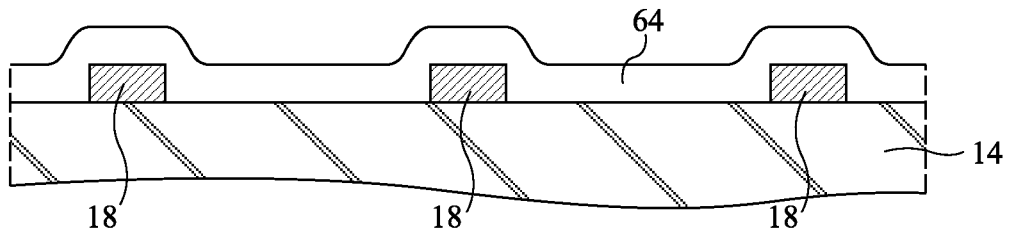
FIGS. 7A to 7D are partial simplified cross-section views of the structures obtained at successive steps of another embodiment of a method of manufacturing the optoelectronic device of FIG. 6.

FIGS. 7A to 7D illustrate steps (5)", (6)", (7)", and (8)" of an embodiment of a method of manufacturing device 60 and replace steps (5) to (7) previously described in relation with FIGS. 4E to 4G, the other steps (1) to (4) and (8) to (14) being identical to those described previously. Steps (5)", (6)", (7)", and (8)" are the following:

(5)" Depositing a layer 64 of a first dielectric material on substrate 14 and on seed islands 18 (FIG. 7A). Layer 64 is made of a first dielectric material which may be selectively etched over the material forming seed islands 18. The first dielectric material is, for example, silicon oxide or silicon nitride. Dielectric layer 64 preferably has a thickness strictly greater than or equal to the thickness of seed islands 18, preferably greater than or equal to at least 1.5 times the thickness of seed islands 18. As an example, layer 64 has a thickness in the range from 1 nm to 100 nm, for example, approximately 60 nm. Layer 64 is for example conformally deposited. Layer 64 thus forms a bump 65 on each seed island 18.

Figure 7B:
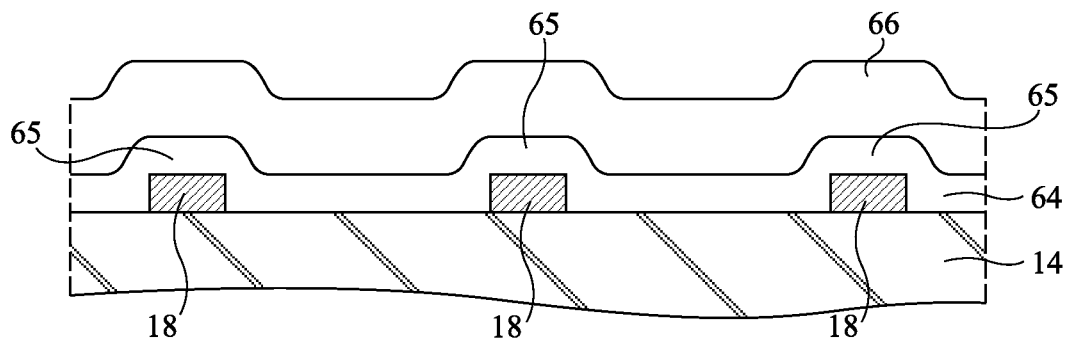

(6)" Depositing a layer 66 of a second dielectric material on layer 64 (FIG. 7B). The second dielectric material is different from the first dielectric material. However, the second dielectric material is selected so that there exists an etching method which enables to non-selectively etch the first and second dielectric materials, substantially at the same speed. The second dielectric material is, for example, silicon oxide when the first dielectric material is silicon nitride or silicon nitride when the first dielectric material is silicon oxide. Dielectric layer 66 has a thickness strictly greater than the thickness of dielectric layer 64, preferably greater than or equal to at least 1.5 times the thickness of layer 64, more preferably equal to or greater than three times the thickness of layer 64. As an example, layer 66 has a thickness in the range from 50 to 200 nm, for example, approximately 100 nm. Layer 66 is for example conformally deposited.

Figure 7C:
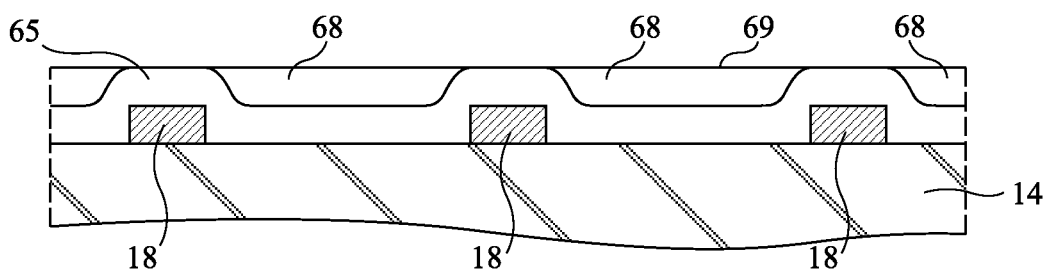

(7)" Etching layer 66 to expose portions of layer 64 (FIG. 7C). The etching may be a CMP (Chemical-Mechanical Planarization). The etching may be stopped as soon as layer 64 starts being visible by an optical inspection, given that the first and second dielectric materials are different. At the end of the etching, portions 68 of layer 66 are left between bumps 65 of layer 64. The structure obtained after this etch step has a substantially planar upper surface 69.

Figure 7D:
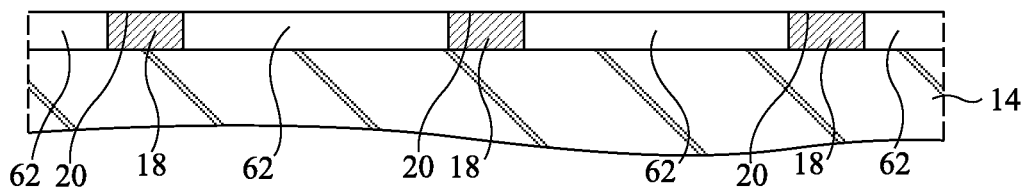

(8)" Etching the remaining portions 68 of layer 66 and layer 64 to expose tops 20 of seed islands 18 (FIG. 7D). The etching is selective over the material forming seed islands 18. It may be a plasma etching or a wet etching. The etching may be stopped when tops 20 of seed islands 18 are visible by an optical inspection, given that the material forming seed islands 18 is different from the first dielectric material. In FIG. 7D, at the end of etching step, the remaining portions 6 of layer 66 have substantially disappeared. However, as a variation, when the etching is stopped, there may remain portions 68 of layer 66 between pads 18.

Figure 8:
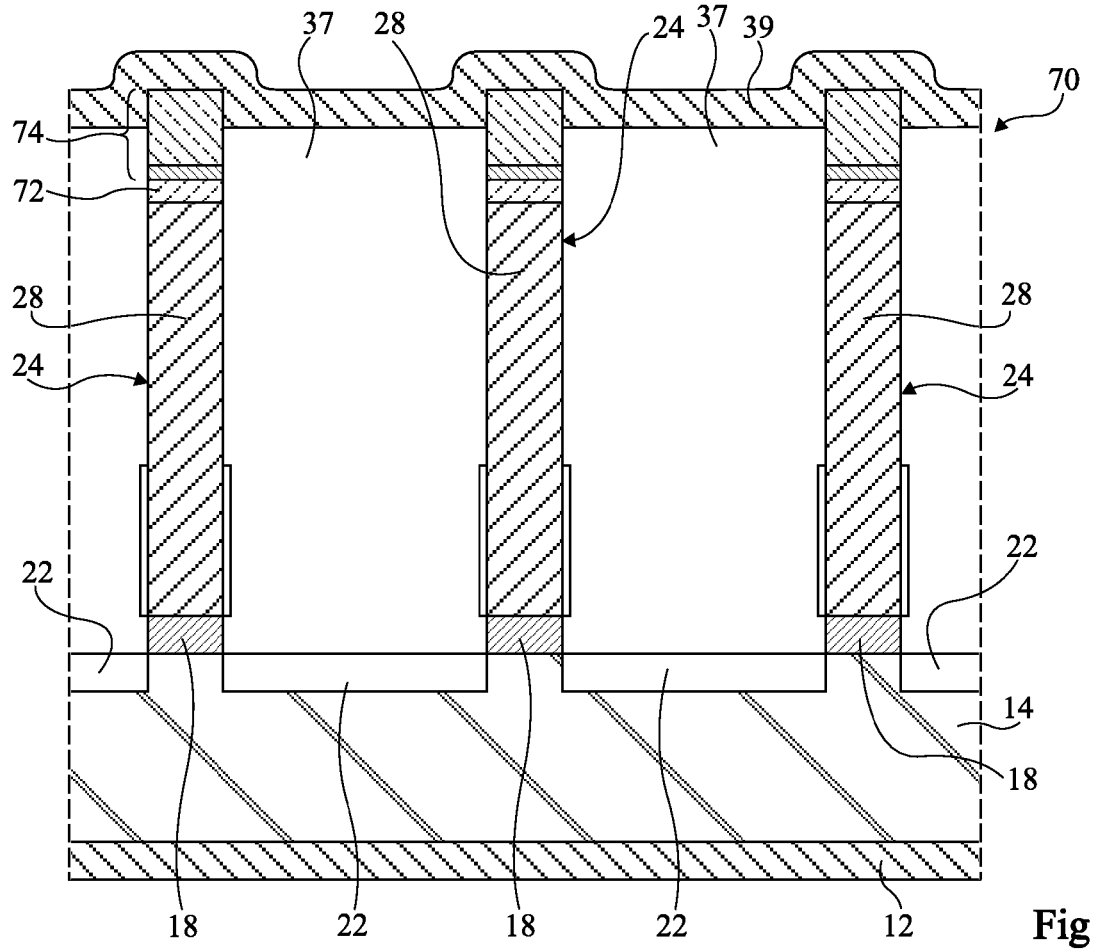
FIG. 8 is a partial simplified cross-section view of another embodiment of an optoelectronic device comprising microwires or nanowires.

FIG. 8 is a partial simplified cross-section view of another embodiment of an optoelectronic device 70 which is capable of emitting an electromagnetic radiation. Device 70 differs from device 10 particularly by the shape of the active portion of each wire 24. Indeed, for each wire 24, active portion 72 only covers the top of wire 24. Active portion 72 may have the same composition as previously-described active layer 30. Further, a stack of semiconductor portions 74 covers active portion 72. The stack of semiconductor layers 74 may have the same composition as previously-described stack 32.

Figure 9:
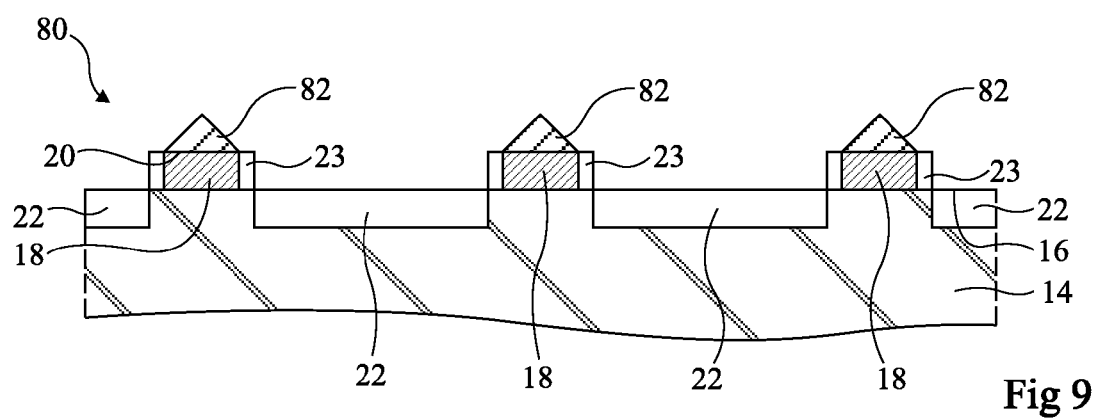
FIG. 9 is a partial simplified cross-section view of an embodiment of an optoelectronic device with pyramidal three-dimensional elements.

FIG. 9 is a partial simplified cross-section view of an embodiment of an optoelectronic device 80 with pyramidal three-dimensional elements at a manufacturing step which follows the step illustrated in FIG. 4G. Three-dimensional elements 82, for example, of conical or tapered shape with a polygonal base, particularly in the shape of a pyramid or of a truncated pyramid, are grown. As an example, when the three-dimensional elements mainly comprise a III-V compound, the material forming seed islands 18 is preferably selected to promote the growth of the III-V compound according to the polarity of the group-III element.

Specific embodiments of the present invention have been described. Various alterations, modifications, and improvements will occur to those skilled in the art. In particular, although embodiments where the wires, covered with a first electrode, are formed on a first surface of a support while a second electrode is formed on a second surface of the support, opposite to the first surface, have been shown in the drawings, it should however be clear that the second electrode may be provided on the side of the first surface.

Further, although, in the previously-described embodiments, each wire 24 comprises a passivated portion 26 at the base of the wire in contact with top 20 of a seed island 18, passivated portion 26 may be absent.

Further, while the different previously-described embodiments of optoelectronic devices are capable of emitting an electromagnetic radiation, such devices can easily be adapted by those skilled in the art to receive an electromagnetic radiation and convert it into an electric signal. Active layer 30 then is the layer where most of the radiation received by the device is captured. Such an adaptation is performed by adapting both active layer 30, 72 of each of wires 24 and by applying an adequate biasing on the semiconductor structure. Such an adaptation of device 10, 70 may be performed to form either an optoelectronic device dedicated to measuring or detecting an electromagnetic radiation, or an optoelectronic device dedicated to photovoltaic applications.

What is claimed is:

1. A method of manufacturing an optoelectronic device comprising the successive steps of:
   providing a substrate;
   depositing a layer on the substrate;
   forming insulating blocks on the layer;
   etching portions of the layer, which are not covered with the insulating blocks to form pads on a surface of the substrate;
   forming a portion of the optoelectronic device, covering at least the lateral sides of each pad defining a dielectric region by oxidation or nitriding of the lateral sides of the pads and the substrate portions which are not covered with the pads;
   removing the insulating blocks; and
   forming semiconductor elements, each element resting on a pad, said dielectric portion comprising a material preventing the growth of the semiconductor elements on the lateral sides.

2. A method of manufacturing an optoelectronic device comprising the successive steps of:
   providing a substrate;
   depositing a layer on the substrate;
   forming insulating blocks on the layer;
   etching portions of the layer which are not covered with the insulating blocks to form pads on a surface of the substrate;
   removing the insulating blocks;
   forming a portion of the optoelectronic device, covering at least the lateral sides of each pad defining a dielectric region by:
      depositing a dielectric layer covering the pads and the substrate between the pads;
      anisotropically etching the dielectric layer to remove the dielectric layer from the substrate and from the top of the pads and leave portions of the dielectric layer on the lateral sides; and
      nitriding the substrate portions which are not covered with the pads; and
   forming semiconductor elements, each element resting on a pad, said dielectric portion comprising a material preventing the growth of the semiconductor elements on the lateral sides.

3. The method of claim 2, further comprising nitriding the tops of the pads.

\* \* \* \* \*